(12) United States Patent
Male et al.

(10) Patent No.: US 7,064,694 B1
(45) Date of Patent: Jun. 20, 2006

(54) MULTI-CYCLE, MULTI-SLOPE ANALOG TO DIGITAL CONVERTER

(75) Inventors: Barry Jon Male, West Granby, CT (US); Wilbur Madison Miller, Jr., Wilton, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/115,689

(22) Filed: Apr. 27, 2005

(51) Int. Cl.
*H03M 1/00* (2006.01)
(52) U.S. Cl. .................................. 341/129; 341/155
(58) Field of Classification Search ............... 341/129, 341/169, 155, 156
See application file for complete search history.

(56) References Cited

U.S. PATENT DOCUMENTS

| | | | | |
|---|---|---|---|---|
| 4,063,236 A | * | 12/1977 | Amemiya et al. | 341/129 |
| 4,357,600 A | * | 11/1982 | Ressmeyer et al. | 341/129 |
| 4,908,623 A | * | 3/1990 | Ullestad | 341/167 |
| 5,019,817 A | * | 5/1991 | Ryder | 341/129 |
| 5,128,676 A | * | 7/1992 | Ordway | 341/167 |
| RE34,899 E | * | 4/1995 | Gessaman et al. | 341/157 |
| 6,002,355 A | * | 12/1999 | Del Signore et al. | 341/155 |
| 6,225,937 B1 | * | 5/2001 | Butler | 341/169 |
| 6,492,929 B1 | * | 12/2002 | Coffey et al. | 341/155 |
| 6,535,156 B1 | * | 3/2003 | Wang et al. | 341/156 |

OTHER PUBLICATIONS

"Understanding Integrating ADCs"; MAXIM; pp. 1-7; May 2002.
"Analog I/O Functionally"; http://www.omega.com/literature/transaction/volume2/analogio2.html; date unknown.

* cited by examiner

*Primary Examiner*—Jean Bruner Jeanglaude
(74) *Attorney, Agent, or Firm*—Alan K. Stewart; W. James Brady, III; Frederick J. Telecky, Jr.

(57) ABSTRACT

A multi-cycle, multi-slope analog to digital converter overlaps charge and discharge periods to reduce latency to the end of the measurement following a sampling window. Additionally, charging and discharging of an integration capacitor during the measurement cycle occurs between defined thresholds so as to avoid saturation within the analog to digital converter.

40 Claims, 6 Drawing Sheets

MULTI-CYCLE, MULTI-SLOPE ANALOG TO DIGITAL CONVERTER

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention relates to analog to digital converters and more specifically to dual ramp integrating analog to digital converters.

There are many types of analog to digital (A/D) converters. Integrating A/D converters are one type of A/D converter known in the art. Integrating A/D converters integrate unknown and fixed charges over fixed and measured time periods respectively.

Dual ramp integrating A/D converters are one known type of integrating A/D converters. The typical dual ramp integrating converter integrates the signal being measured for a fixed period of time onto a capacitor and then de-integrates the capacitor charge back to the starting voltage using a reference voltage as the input. The converter measures the time it takes to return to the starting voltage. The resulting digital conversion in the time counter or digital accumulator is then proportional to the ratio of the unknown and reference signals.

One problem with this type of A/D converter is that the integration signal must be constrained so as not to cause the integration capacitor and associated analog circuitry to saturate. This limits the dynamic range of the integration state.

A second problem with this type of converter is the defined boundary between the integration of the input signal and the conversion of that signal into a digital value. The need to perform de-integration introduces latency in the delivery of the digital information. This latency typically increases as the number of bits of A/D resolution increases.

In view of the foregoing it would be desirable to have a dual slope integrating A/D converter that avoids the above-described problems associated with saturation of the integration signal and which additionally reduces the conversion latency.

BRIEF SUMMARY OF THE INVENTION

A multi-cycle, multi-slope integrating A/D converter is disclosed that avoids the problem associated with saturation of the integration signal and additionally reduces the conversion latency. The disclosed A/D converter employs multiple charge/discharge cycles between fixed first and second voltage levels during the integration period. The use of multiple charge/discharge cycles prevents the integration signal from saturating. Additionally, this approach allows a significant portion of the conversion counts to be accumulated during the sampling window in which the input signal is being measured, thus eliminating most of the latency that is experienced during the conversion phase of typical integrating dual slope A/D converters. The residual capacitor charge at the end of the conversion performed at a first deintegration rate is measured by deintegrating as a binary weighted lower rate. In this manner, the A/D converter accumulates finer resolution in the LSB portion of the accumulator at the end of the sampling window.

Other features, aspects and advantages of the presently disclosed integrating A/D converter and method of performing A/D conversion will be apparent to those of ordinary skill in the art from the Detailed Description of the Invention that follows.

BRIEF DESCRIPTION OF THE SEVERAL VIEWS OF THE DRAWINGS

The invention will be more fully understood from the Detailed Description of the Invention taken in conjunction with the following drawings of which.

DETAILED DESCRIPTION OF THE INVENTION

A multi-cycle, multi-slope integrating A/D converter is disclosed that avoids the problem associated with saturation of the integration signal and additionally reduces the conversion latency. The disclosed A/D converter employs multiple charge/discharge cycles between fixed first and second voltage levels during the integration period. The use of multiple charge/discharge cycles prevents the integration signal from saturating. Additionally, the disclosed technique allows the conversion counts to be accumulated during the period that the input signal is being measured, thus eliminating most of the latency that is experienced during the conversion phase of typical integrating dual slope A/D converters. The residual capacitor charge at the end of the conversion is measured by de-integrating at a binary weighted lower rate. In this manner, the A/D converter accumulates finer resolution in the LSB portion of the accumulator at the end of the "sampling window".

Figure 1:
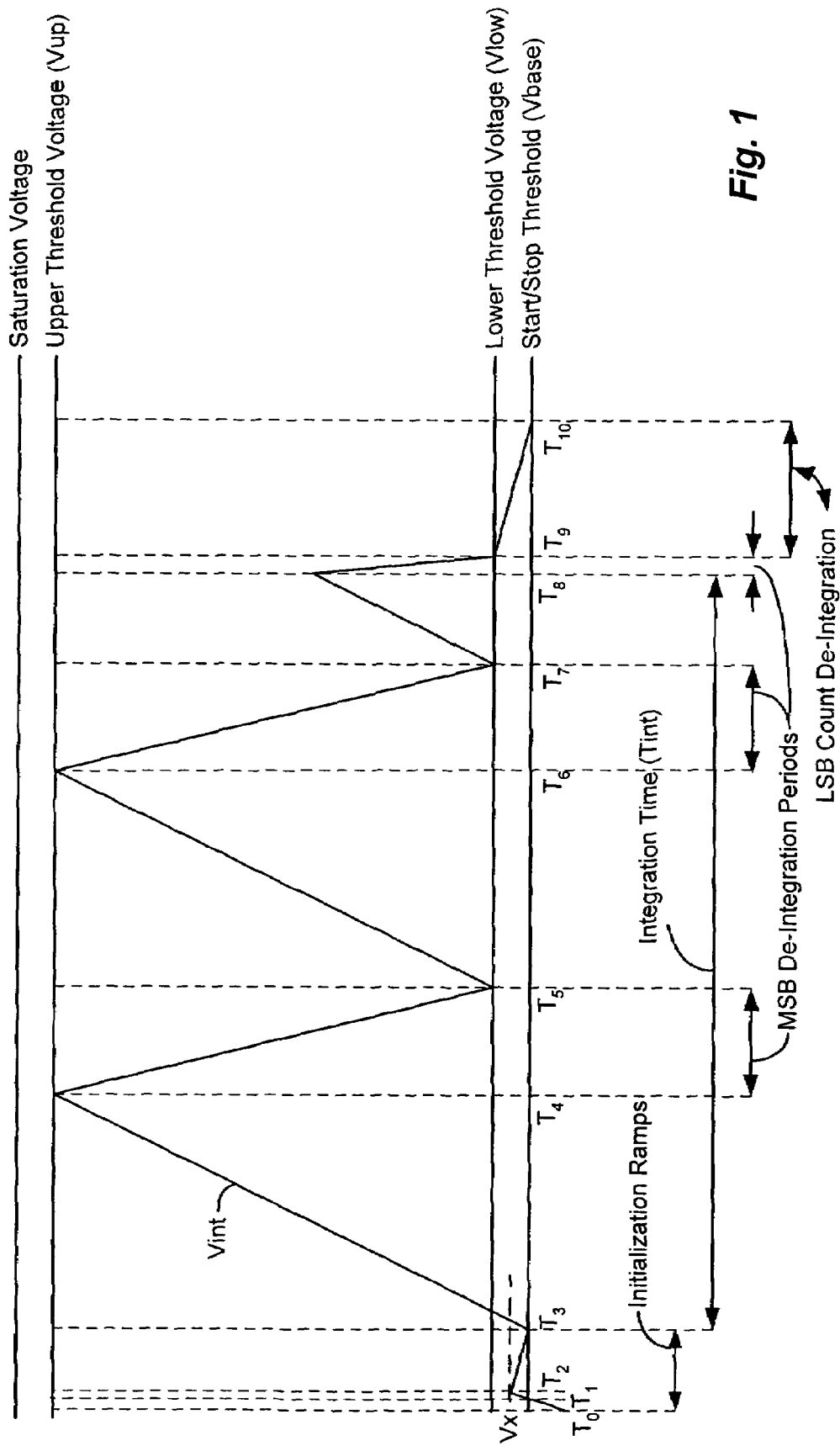
FIG. 1 is a timing diagram illustrating the presently disclosed technique for performing analog to digital conversion using a multi-cycle, multi-slope integrating A/D converter operative in accordance with the present invention.
Figure 3:
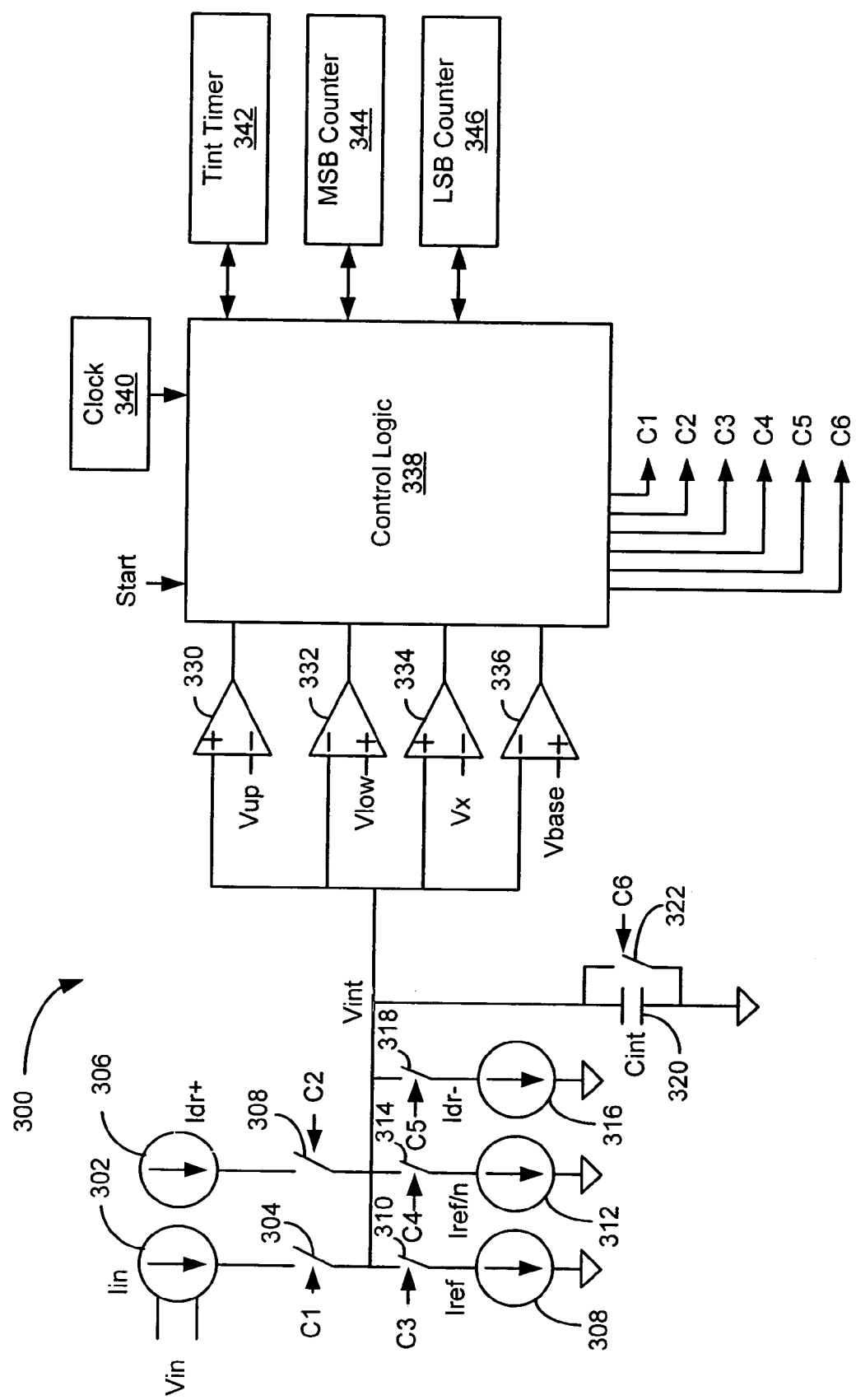
FIG. 3 is a block diagram depicting a multi-cycle, multi-slope A/D converter in accordance with the present invention.

More specifically, FIG. 1 graphically depicts the timing and operation of the presently disclosed multi-cycle, multi-slope integrating A/D converter and FIG. 3 is a block diagram of an illustrative embodiment of an A/D converter 300 operative in accordance with the present invention.

The dual slope integrating A/D converter employs multiple charge/discharge cycles between fixed voltages during a sampling period or window Tint. Referring to FIGS. 1 and 3, the input voltage Vin is applied to a variable current source Iin to generate a current that is applied to an integration capacitor Cint 320 to charge the capacitor Cint 320. The current produced by the current source Iin 302 determines the rate of charge of integration capacitor Cint 320 and thus, the slope of the voltage ramp on the integration capacitor Cint 320. The current sources described herein in conjunction with the integration capacitor Cint form an integrator/de-integrator that produces a sawtooth like waveform on the output of the integrator/de-integrator.

The current produced by the current source Iin 302 is applied to the integration capacitor Cint 320 starting at the beginning of the sampling window Tint and is applied to the integration capacitor Cint 320 for the duration of the sampling window Tint. In the illustrative timing diagram, the current produced by the current source Iin 302 is integrated for the entire sampling window Tint, which extends between time T3 and time T8 in FIG. 1. The sampling window Tint extends for a fixed predetermined time period that is established by a timer identified as Tint Timer 342.

To start an A/D conversion, a start signal is applied to control logic 338. In response, the A/D converter 300 initializes the A/D converter circuitry by discharging Cint 320 and clearing certain counters used in the conversion process, namely, an MSB counter 344 and an LSB counter 346.

The A/D converter 300 then applies a charging current to the integration capacitor Cint 320 to produce a first ramp voltage on the the capacitor Cint 320 that increases from T0 to a voltage Vx at time T2. The voltage Vx is a predetermined voltage above the start/stop threshold voltage (Vbase). This first ramp voltage is referred to herein as a first dummy ramp since the ramp voltage is part of a pre-measurement initialization phase. More specifically, as depicted in FIG. 1, the first dummy ramp voltage is depicted as commencing at time T0, crossing the start/stop threshold Vbase at time T1 and continuing to Vx at time T2. The start/stop threshold voltage Vbase represents the voltage at which the A/D conversion measurement begins and ends; i.e. at times T3 and T10 in the illustrative timing diagram depicted in FIG. 1.

Once the voltage on the integration capacitor Cint 320 reaches Vx, the charging current is turned off and a second current source is switched on that discharges the integration capacitor Cint 320. The second current source in combination with the first current source produces a net current that produces a decreasing voltage ramp on the integration capacitor Cint 320 that starts at voltage Vx at time T2 and ramps downward to the start/stop threshold voltage Vbase at time T3. The ramp voltage from Vx to Vbase is referred to herein as a second dummy ramp voltage since this ramp is also part of the pre-measurement initialization that accurately and repeatedly establishes the voltage on the integration capacitor Cint 320 at the start of the sampling window Tint. In this manner, the output voltage on the integration capacitor Cint is accurately established at Vbase prior to the commencement of the measurement.

When the voltage on the integration capacitor Cint reaches the start/stop threshold voltage Vbase, the second current source is switched off in preparation for the initiation of the sampling window.

At the commencement of the next clock cycle following the determination that the voltage on the integration capacitor Cint 320 has reached Vbase, sampling window Tint is initiated and the Iin current source 302 is switched on for the duration of Tint. The coupling of the Iin current source to the integration capacitor Cint produces a positively sloped ramp voltage on the capacitor Cint 320 as depicted commencing at time T3 in FIG. 1. After the voltage on the integration capacitor Cint 320 reaches a predetermined upper threshold voltage Vup, at the commencement of the next clock cycle, a current source Iref 308 is switched on. The current source Iref 308 is configured to draw charge off of the integration capacitor Cint 320. Since the current source Iref 308 is switched on at the commencement of the next clock cycle after the voltage on the integration capacitor Cint 320 reaches Vup, the voltage on the integration capacitor Cint 320 will typically overshoot Vup by an amount based on the point in the clock cycle at which the voltage on the integration capacitor Cint 320 reached Vup.

The magnitude of the current source Iref is greater than the magnitude of the current source Iin and thus the voltage on the integration capacitor Cint 320 exhibits a negative slope commencing at time T4 when the current source Iref is switched on.

Coincident with the turning on of the current source Iref, a most significant bit counter (MSB Counter) 344 commences to count clock pulses provided by a clock 340.

Figure 2A:
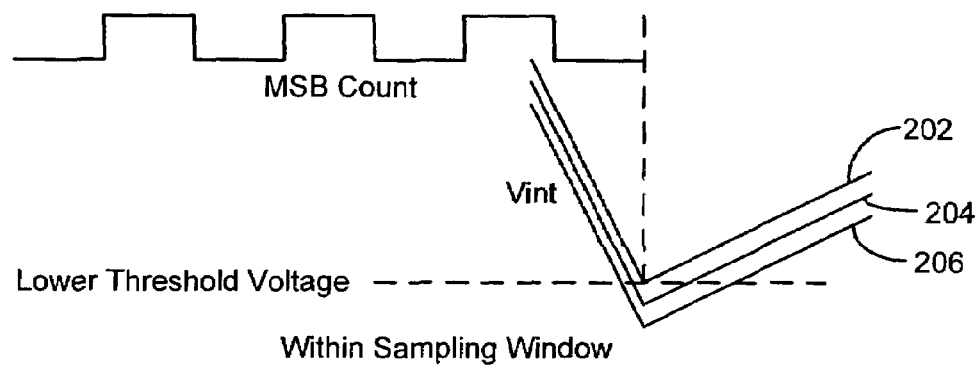
FIG. 2a is a timing diagram illustrating overshoot of the integrator output signal below the lower threshold voltage during the sampling window.

The voltage on the integration capacitor Cint 320 continues to decrease while the current source Iref 308 is on. After the voltage on the integration capacitor Cint 320 reaches a lower threshold voltage, at the commencement of the next clock cycle, the current source Iref 308 is switched off and the MSB counter 344 also ceases to count clock pulses. As a result of the fact that the current source Iref 308 is not switched off precisely at the time when Vint equals Vlow but rather, continues to decrease until the commencement of the next clock cycle following the determination that the voltage on the integration capacitor Cint 320 has reached Vlow, the negative going ramp produced by the current source Iref 308 will typically extend below the lower threshold voltage Vlow by an amount dependent upon the point in the clock cycle at which the voltage on the integration capacitor Cint 320 was determined to equal Vlow. This is illustrated in FIG. 2a. The uppermost waveform 202 depicts the circumstance where Vint equals the lower threshold voltage Vlow at the time of the commencement of the next clock cycle. The middle waveform 204 depicts the circumstance where the ramp voltage Vint reaches Vlow slightly before the commencement of the next clock cycle and continues to decrease until the commencement of the next clock cycle. Thus, Vint overshoots the lower threshold voltage slightly as illustrated in FIG. 2a. Finally, the lowest waveform 206 depicts the circumstance where Vint reaches Vlow a greater time interval before the commencement of the next clock cycle than occurred with respect to the middle waveform. Consequently, Vint overshoots the lower threshold voltage further than occurred with the middle waveform since the time period until the commencement of the next clock cycle is greater.

Thus, for each full de-integration cycle that is completed an integral number of most significant bit (MSB) counts are accumulated in the MSB counter 344. It should be appreciated that if the input voltage Vin is higher, the current produced by the current source Iin 302 is greater, producing a longer discharge cycle between times T4 and T5 and a greater number of clock pulses that will be accumulated in the MSB counter 344. Conversely, if Vin is lower, the current produced by the current source Iin 302 is lower, producing a shorter discharge cycle between times T4 and T5 and fewer clock pulses that will be counted in the MSB counter 344.

The above described process repeats until Tint expires which, as depicted in the illustrative timing diagram, occurs at time T8. When Tint expires, the current source Iin 302 is switched off and the integration capacitor Cint 320 ceases to accumulate charge.

Depending on the voltage on the integration capacitor Cint 320 at the close of the sampling window Tint a full de-integration period can remain and typically a partial de-integration period does remain. More specifically, if the integrator output voltage is at the upper threshold voltage Vup at the expiration of Tint, a full de-integration period remains. If the integrator output voltage is at a voltage between the upper threshold voltage and the lower threshold voltage Vlow, less than a full de-integration period remains. In either case, at the end of the sampling window Tint, the current source Iin 302 is switched off and the current source Iref 308 is switched on. Coincident with the turning on of the current source Iref 308, the MSB Counter 344 is turned on and the MSB counter continues to count clock pulses from the clock 340 so that the MSB counter produces a cumulative count of all clock pulses counted during the discharge cycles. In the example depicted in FIG. 1 this would include the clock pulses counted in the discharge cycle between the times T4 and T5, the discharge cycle between the times T6 and T7 and the discharge cycle following the end of the sampling window between T8 and T9.

If the end of the last de-integration cycle coincides with the end of Tint on a clock cycle boundary, then no further de-integration cycles to accumulate MSB counts are undertaken.

Figure 2B:
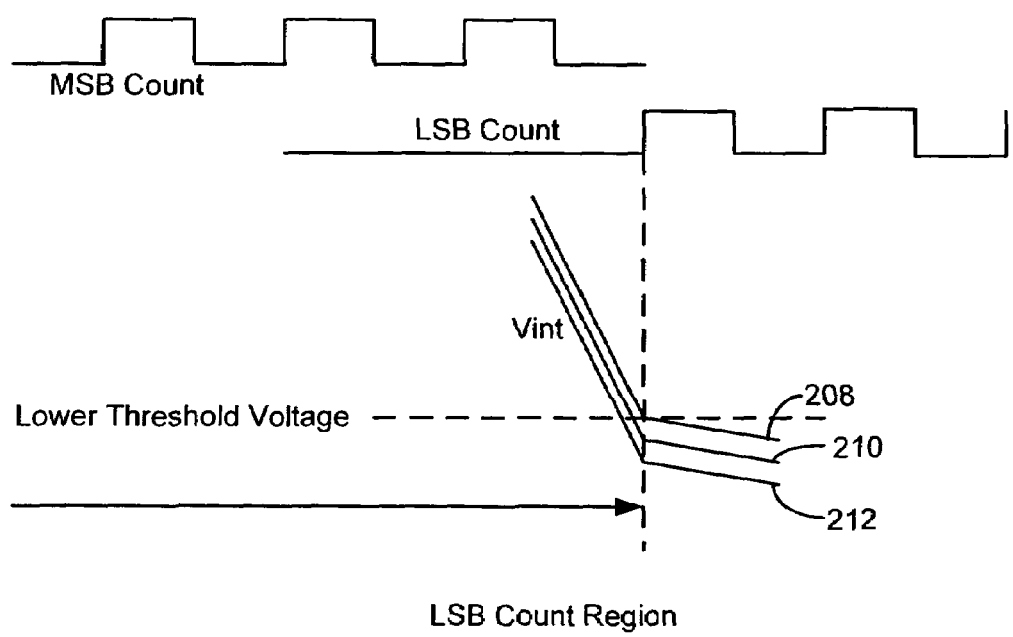
FIG. 2b is a timing diagram illustrating overshoot of the integrator output signal below the lower threshold voltage at the end of the sampling window.

At the end of the sampling window Tint, if the voltage on the integration capacitor Cint 320 is above the lower threshold voltage Vlow, then the current source Iref 308 is switched on along with the MSB counter 344 to de-integrate the voltage on the integration capacitor Cint 320. The MSB Counter 344 counts clock pulses produced by clock 340 during the de-integration cycle. The system detects when the voltage on the integration capacitor Cint 320 has reached the lower threshold voltage Vlow and at the start of the next clock cycle, the current source Iref 308 is switched off and the MSB counter 344 is disabled so as to cease to count clock pulses. Since the current source Iref typically remains on for a portion of a clock cycle after the voltage on the integration capacitor Cint has reached Vlow, the ramp voltage will typically proceed below Vlow. This circumstance is illustrated in FIG. 2b. Referring to FIG. 2b, the uppermost waveform 208 depicts the circumstance in which the ramp voltage reached Vlow coincident with the commencement of a clock cycle. The middle waveform 210 depicts a circumstance in which the voltage on the integration capacitor Cint 320 reached Vlow slightly before the start of a clock cycle and the lowest waveform 212 depicts the circumstance in which the voltage on the integration capacitor Cint 320 reached Vlow a greater time before the start of a clock cycle than the middle waveform 210.

In any of the above-described circumstances, the last de-integration period (in the illustrated example at time T9) leaves the voltage on the integration capacitor Cint 320 either at or below the lower threshold voltage Vlow but typically above the start/stop threshold voltage Vbase. The voltage on the integration capacitor Cint 320 is then further de-integrated back to the start/stop threshold voltage Vbase.

The final de-integration to Vbase proceeds at a rate that is a binary fraction of the normal de-integration rate. More specifically, when de-integrating from the integration capacitor voltage at the end of the discharge cycle at T9 to the start/stop threshold voltage Vbase, a current source 312 having a current Iref/n is employed where n equals the number of least significant bits maintained by the LSB Counter 346. In the final de-integration phase, the Iref/n current source 312 is turned on and the least significant bit (LSB) counter 346 is activated. Using the Iref/n current source 312, the voltage on the integrator capacitor Cint 320 is discharged from the voltage at the end of the last discharge cycle to the baseline start/stop voltage Vbase. Once the voltage on the integrator capacitor Cint 320 reaches the start/stop threshold voltage Vbase, the LSB counter 346 is stopped and the current source Iref/n 312 is switched off.

The MSB Counter 344 and the LSB Counter 346 contain the most significant and least significant bits respectively that are representative of the analog input voltage Vin.

Thus, all charge that is accumulated in the integration capacitor Cint 320 as a result of the application of the unknown input voltage Vin is removed during all or some of the following events:

a. full de-integration discharge cycles that remove a charge from the integrator capacitor Cint 320 and result in the accumulation of an integral number of MSB counts in the MSB Counter 344;

b. a partial de-integration cycle at the end of the sample window in which MSB counts are accumulated during the respective partial de-integration cycle; and/or c. a final "slow" or "vernier" de-integration discharge cycle in which accumulated LSB counts are weighted by use of a current source Iref/n 312 having a reduced current.

It is noted that the starting and ending points for the sampling window Tint correspond to the starting and ending points achieved in a conventional dual slope integrating A/D converter.

Since discharge or de-integration cycles largely overlap the integration during the sampling window Tint, the latency from the end of the sampling window until the availability of the conversion output is reduced. In the illustrated timing diagram, the latency period involves only the time between the end of the sampling window at T8 and the end of the measurement at T10. The de-integration periods between T4 and T5 and between T6 and T7 overlap the sampling window Tint and thus do not extend the latency period.

Each time the ramp reaches the upper threshold voltage Vup during the sampling window Tint, the control logic 338 starts the MSB counter 344 and switches on the Iref current source 308 to discharge the integration capacitor Cint 320. In this manner the voltage on the integration capacitor 320 is prevented from reaching a saturation voltage for the A/D converter 300.

A discharge cycle is always stopped at the completion of the clock cycle after the lower threshold voltage Vlow has been crossed in order for the de-integrator to remove the proper amount of charge corresponding to the associated MSB count that is accumulated. Consequently, as previously explained the voltage on the integration capacitor Cint 320 typically overshoots the lower threshold voltage Vlow before switching off the Iref current source 308 to initiate another integration cycle or the LSB de-integration phase.

While the timing diagram of FIG. 1 illustrates a conversion in which two full discharge cycles overlap the sampling window Tint, it should be appreciated that there may be no overlap of a discharge cycle with the sampling window Tint if the input voltage Vin is sufficiently low. Additionally, if the input voltage Vin is sufficiently high, there may be many full discharge cycles within the sampling window Tint.

A block diagram of the multi-cycle, multi-slope A/D converter 300 operative in accordance with the present invention is depicted in FIG. 3. The converter 300 includes the integration capacitor 320 that can be discharged via switch 322 via control line C6 under the control of Control Logic 338.

A current source Idr+ 306 may be switched on via switch 308 via control line C2 under the control of the Control Logic 338 to initiate the positive going dummy ramp used in the initialization of the converter 300. Additionally, a current source Idr– 316 may be switched on to discharge the integration capacitor 320 to produce a negative going dummy ramp used to bring the voltage on the integration capacitor Cint 320 to Vbase prior to the commencement of the sampling window Tint. It should be noted that while the current source Idr– 316 is depicted as a separate current source, the current source Iref/n 312 may be employed to generate the negative going dummy ramp. Use of the Iref/n current source 312 to generate the negative going dummy ramp has the added advantage of reducing the error budget since the same current source is employed to de-integrate to the start-stop threshold voltage Vbase. The Iref/n current source 312 is switched on via switch 314 via control line C4 under the control of the Control Logic 338.

The current source Iin 302 produces a current that is proportional to the unknown input voltage Vin. The current source In 302 is switched on by switch 304 via control line C1 under the control of the Control Logic 338.

The current source Iref 308 produces the discharge current that discharges the integration capacitor Cint 320. The current source 308 is switched on by switch 310 via control line C3 under the control of the Control Logic 338.

The current source Iref/n 312 produces a weighted discharge current that is employed to produce a reduced rate discharge of the integration capacitor Cint 320 at the end of the measurement cycle. This current source is employed in the generation of the LSB count as described above. The Iref/n current source 312 is switched on by switch 314 via control line C4 under the control of the Control Logic 338.

Comparators 330, 332, 334 and 336 are employed to determine when the voltage Vint on the integration capacitor Cint 320 has reached the voltage Vup, Vlow, Vx and Vbase respectively. The outputs of the comparators 330, 332, 334 and 336 are coupled to the Control Logic 338.

A start signal is coupled to the Control Logic 338 and the assertion of the start signal initiates A/D conversion. A clock 340 is also coupled to the Control Logic 338. The clock 340 produces pulses that are counted by the MSB Counter 344 and the LSB Counter 346 as described herein.

The Tint Timer 342 generates the sample window Tint signal that defines the integration period during which the current source Iin 302 is switched on.

Figure 4A:
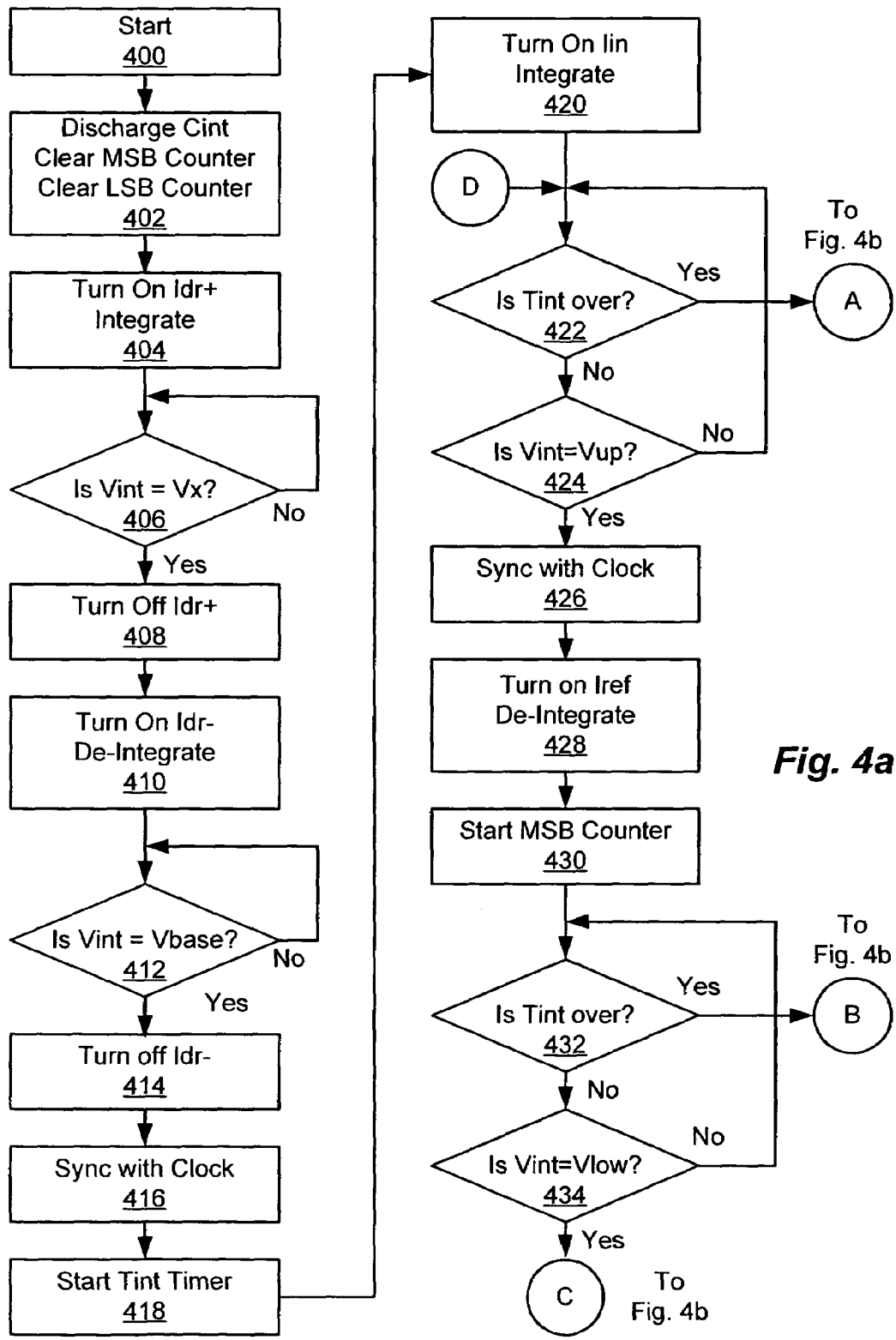
FIGS. 4a and 4b are a flow diagram illustrating the operation of the multi-cycle, multi-slope A/D converter of FIG. 3 including the control logic depicted in FIG. 3.
Figure 4B:
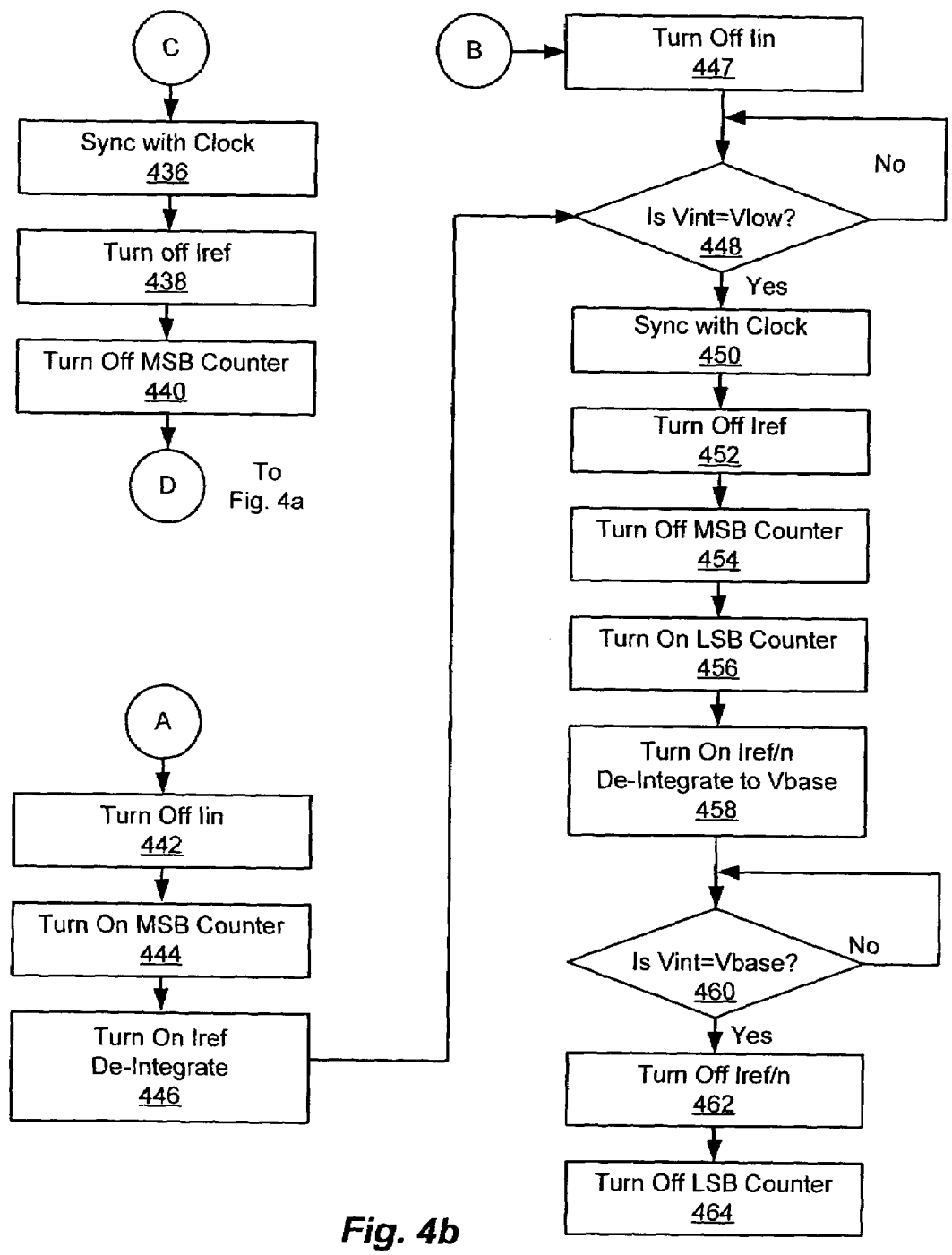

The operation of the Control Logic 338 and the presently disclosed A/D converter will be further understood with reference to the flow chart depicted in FIGS. 4a and 4b. Referring to FIGS. 3, 4a and 4b, an A/D conversion in accordance with the presently disclosed technique is initiated by the assertion of a start signal as depicted in step 400. The start signal is coupled to the Control Logic 338. In response to the assertion of the start signal, the Control Logic 338 initializes the integration capacitor Cint 320, the MSB Counter 344 and the LSB Counter 346 as illustrated in step 402. More specifically, the Control Logic 338 asserts control line C6 to close switch 322 to discharge integration capacitor Cint 320. Additionally, the Control Logic 338 clears the MSB and LSB Counters 344, 346.

After initializing the A/D circuitry, the Control Logic 338 asserts control line C2 to turn on switch 308 in order to turn on the dummy ramp current source Idr+ 306 as depicted in step 404. When the Control Logic 338 senses that Vint equals Vx as illustrated in decision step 406 the Control Logic 338 turns off current source Idr+ 306 as depicted in step 408 by de-asserting control line C2 so as to open switch 308.

The Control Logic next turns on current source Idr– 316 or alternatively, current source Iref/n 312 to generate the negatively sloped dummy ramp in order to drive Vint to Vbase as shown in step 410. When the voltage Vint on the integration capacitor discharges to Vbase, as illustrated in decision step 412, the Control Logic turns off the Idr– current source 316 or the Iref/n current source 312 as applicable as indicated in step 414. As depicted in step 416, the Control Logic 338 next syncs the commencement of the sampling window Tint with the start of the next clock cycle. Upon the commencement of the next clock cycle, as indicated in step 418, the Tint timer is initiated. Additionally, as shown in step 420, the Iin current source is switched on to begin charging the integration capacitor Cint 320. When the Iin current source is switched on, the voltage on the integration capacitor Cint 320 exhibits a positively sloped ramp.

As depicted in decision step 422 the Control Logic 338 determines whether the Tint Timer 342 has expired. If the Tint Timer has not expired control passes to decision step 424. As depicted in decision step 424 a determination is made by the Control Logic 338 whether the voltage Vint on the integration capacitor Cint has reached the upper threshold voltage Vup. This determination is made by inspection of the output of comparator 330. If the voltage Vint has not reached the upper threshold voltage Vup, the current source Iin 302 continues to charge the integration capacitor Cint 320. If the voltage Vint has reached the upper threshold voltage Vup as indicated by the output of the comparator 330, the Control Logic 338 syncs with the clock 340 by awaiting the start of the next clock cycle as indicated in step 426. Upon the occurrence of the start of the next clock cycle, the Iref current source 308 is turned on to initialize a discharge cycle as shown in step 428. Coincident with the initiation of the discharge cycle, as indicated in step 430, the MSB Counter 344 is enabled by the Control Logic 338 to commence the counting of clock pulses from the clock 340.

As illustrated at decision step 432, a determination is made by the Control Logic whether the Tint Timer has expired indicating that the sampling window has ended. If the sampling window Tint has not ended, control passes to decision step 434. As indicated in decision step 434, the Control Logic 338 next determines whether the voltage Vint has reached the lower threshold voltage Vlow by inspection of the output of the comparator 332. If the voltage has not reached the lower threshold voltage Vlow, the Iref current source 308 continues to discharge the integration capacitor Cint 320. If the voltage Vint equals the lower threshold voltage Vlow control passes to step 436 (FIG. 4b). As indicated in step 436, the Control Logic syncs with the clock by awaiting the start of the next clock cycle. At the start of the next clock cycle, as depicted in step 438, the Iref current source 308 is switched off and the MSB Counter 344 is disabled so that the counter will not accumulate further clock pulses as illustrated in step 440. Control then passes to decision step 422 (FIG. 4a) as the voltage Vint ramps upward due to the current source Iin 302. The above described loop continues until the Tint Timer 342 expires indicating the end of the sampling window Tint.

If the Control Logic 338 detects the expiration of the Tint Timer 342 during a period when the Iref current source 308 is switched off as indicated at decision step 422 control passes to step 442 (FIG. 4b). In response to the determination that the Tint Timer 342 has expired, the Control Logic 338 turns off the Iin current source 302 as illustrated in step 442. The Control Logic 338 then initiates a post sampling window de-integration cycle in which the voltage Vint on the integration capacitor is discharged by the Iref current source 308 to approximately the lower threshold voltage Vlow. This post sampling window de-integration cycle will produce a full discharge cycle if the residual voltage Vint at the expiration of the Tint Timer 342 was equal to the upper threshold voltage Vup or a partial discharge cycle if the residual voltage Vint at the expiration of the Tint Timer 342 was less than the upper threshold voltage Vup.

More specifically, after turning off the Iin current source 302, the Control Logic 338 enables the MSB Counter 344 and turns on the Iref current source 308 as illustrated in steps 444 and 446 respectively so that the MSB Counter 344 will continue to count clock pulses during the discharge of the integration capacitor Cint 320. As indicated in decision step 448, the Control Logic 338 determines if the voltage on the integration capacitor Cint 320 equals Vlow by inspecting the output of the comparator 332. When the voltage Vint equals the lower threshold voltage Vlow, the Control Logic syncs with the clock 340 by awaiting the start of the next clock cycle. As discussed above, while awaiting the start of the next clock cycle, the integration capacitor Cint typically discharges below the lower threshold voltage Vlow. At the start of the next clock cycle, as indicated in step 452, the Iref current source 308 is switched off and the MSB Counter 344 is disabled so as to cease counting clock pulses as depicted in step 454.

The value retained in the MSB counter 344 represents the most significant bits of the digital representation of the analog input voltage Vin.

The least significant bits (LSBs) are obtained as described in steps 456 through 464.

As indicated in step 456 the LSB Counter 346 is enabled by the Control Logic 338 and at the same time, as depicted in step 458 the Iref/n current source 312 is enabled by the Control Logic to de-integrate the integration capacitor Cint 320 to the start/stop threshold voltage Vbase. The Iref/n current source 312 produces a discharge current equal to Iref divided by $2^n$. Thus, if there are three least significant bits, the current produced by the Iref/n current source 312 equals ⅛th of the current produced by the Iref current source 308. While the Iref and Iref/n current sources 308, 312 are depicted as separate current sources in FIG. 3, it should be appreciated that a single current source may be employed in which the current produced by the current source is controllable by the Control Logic 338 to produce the desired current values. More specifically, the single current source may comprise a digital to analog converter which produces the specified currents Iref and Iref/n in response to defined digital inputs from the Control Logic 338.

While the voltage Vint on the integration capacitor Cint ramps downward toward the start stop threshold voltage Vbase, the LSB counter counts clock pulses from clock 340.

As depicted in decision step 460, as the value of the voltage Vint ramps downward toward Vbase, a determination is made whether Vint equals Vbase. When the Control Logic 338 determines from inspection of the output of the comparator 336 that the voltage Vint on the integration capacitor Cint 320 equals the start stop threshold voltage Vbase, as indicated in decision step 460, the Control Logic 338 turns off the current source Iref/n 312 as indicated in step 462 and disables the LSB Counter 346 as depicted in step 464. This completes the A/D conversion. The MSB and LSB Counters 344 and 346 respectively then contain the most significant and least significant bits of the digital representation of the analog input voltage Vin.

The data in the MSB and LSB Counters may then be retrieved from the A/D converter.

If the sampling window Tint expires during a discharge cycle as determined in decision step 432 (FIG. 4a) the Iin current source 302 is switched off as depicted in step 447 and control passes to decision step 448 (FIG. 4b). Processing continues as described above with respect to steps 448, 450, 452, 454, 456, 458, 460, 462 and 464.

While the illustrated embodiment employs a current source 312 having a current equal to Iref/$2^n$ that is used to produce the final ramp voltage on the integration capacitor that ends at the start/stop voltage (Vbase), if the current source 312 is not employed, the second threshold voltage may be equal to the start/stop threshold voltage (Vbase). In this case, the conversion will proceed based on the use of the current source 308 having a current equal to Iref and the measurement will be completed when the ramp voltage on the integration capacitor Cint intersects the start/stop voltage (Vbase) following the end of the sampling window.

The Control Logic 338 may comprise a hardware controller operative to perform the functions described herein. Alternatively, the Control Logic 338 may comprise a processor operative to execute instructions out of a memory or a microcontroller operative to implement the above-described control functions employing firmware to define the control logic. Furthermore, control logic may be considered as including the threshold comparators depicted in FIG. 3.

By way of example, and not limitation, exemplary values of clock values, current source values, thresholds and voltages employed in an analog to digital converter operative in accordance with the presently disclosed technique are described below.

By way of illustration, in one exemplary embodiment of the presently disclosed multi-slope analog to digital converter exemplary values are as follows:

Vup=5 V
Vlow=4 V
Vx=3.975
Vbase=3.94 V
Tint=16.6 mS
Iref=48 uA
Iin max=800 mA for Vin max or a maximum input current to the analog to digital converter
uA/Count=800 ma/32768=24.41 uA for 15 bits of resolution
11 Most significant bits; 4 Least significant bits
Iref/n=1/16th of Iref
Idr+=any suitable charge current. The higher the current, the most rapid the conversion.
Idr−=Iref/n. The use of use of the Iref/n current source as the Idr− current source minimizes variations in the detection of the starting and ending ports of the conversion.
Clock Frequency for MSB Counter/LSB Counter=61.75 Khz.

The above-described implementation employs a conversion time of 16.6 ms which corresponds to one cycle at 60 cycles per second. The specification of Tint=16.6 mS serves to filter out AC noise.

The above-identified values are simply illustrative of one implementation and it should be recognized that the actual values in any given implementation may be varied based upon specific design objectives without departing from the inventive concepts disclosed herein.

Figure 5:
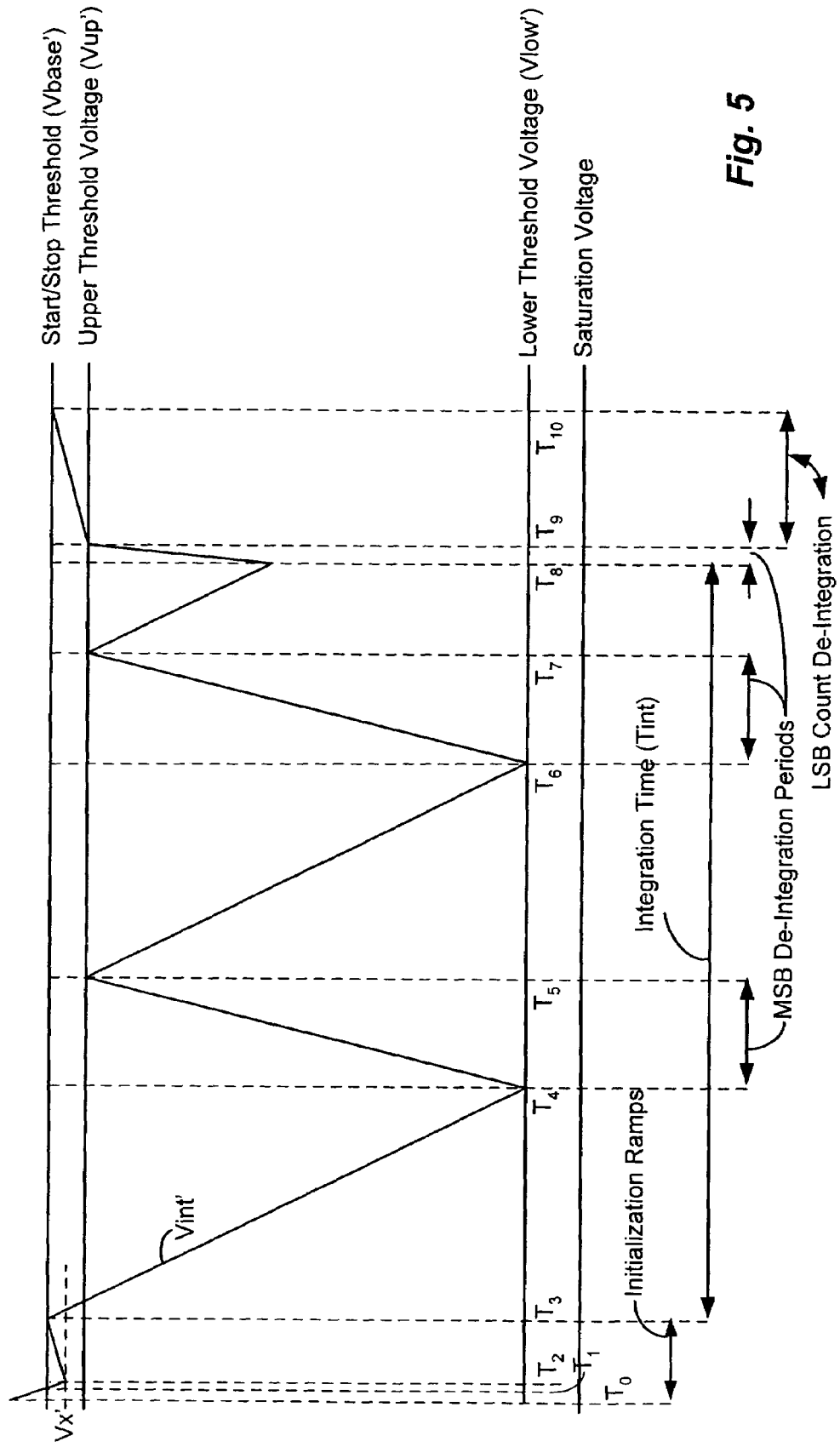
FIG. 5 is a timing diagram illustrating the presently disclosed technique for performing analog to digital conversion using a multi-cycle, multi-slope integrating A/D converter which is conceptually the mirror image of the timing diagram depicted in FIG. 1.

Moreover, while the embodiment of the multi-cycle, multi-slope A/D converter is described above with respect to a system in which an increase in the input signal produces an increase in the charging current Iin and the current Iref comprises a current that discharges the integration capacitor Cint, it should be appreciated that a multi-cycle, multi-slope A/D converter may be implemented in which the system conceptually exhibits the mirror image of the waveform depicted in FIG. 1. This embodiment is illustrated in the timing diagram of FIG. 5. More specifically, an integration capacitor Cint' (not shown) may be charged to a predetermined voltage (e.g. the upper supply voltage). The integration capacitor Cint' may then be charged during a first dummy ramp portion and then discharged during a second dummy ramp portion until the voltage Vint' on the integration capacitor Cint' reaches a start/stop threshold voltage (Vbase'). At the start of the next clock cycle, the sampling window is initiated and a current source Iin' (not shown) that is responsive to the input signal is coupled to the integration capacitor Cint' and is employed to charge the integration capacitor Cint' from the start/stop threshold voltage Vbase'. After the voltage Vint' on the integration capacitor Cint' reaches the lower threshold voltage (Vlow'), at the commencement of the next clock cycle a second current source Iref' (not shown) is switched on to discharge the integration capacitor Cint'. During the discharging of the integration capacitor Cint', MSB counts are accumulated as described hereinabove. At the start of the next clock cycle after Vint' reaches an upper threshold voltage (Vup') the discharging current source Iref' is switched off and the MSB counter ceases to count clock pulses. Accumulation of clock pulses continues during period of the sampling window in which the current source Iref' is switched on and in the post sampling window period as described hereinabove recognizing the mirrored nature of the Vint' waveform.

It will be appreciated by those of ordinary skill in the art that other modifications to and variations of the above-described multi-cycle, multi slope A/D converter and methods for operating the same may be made without departing from the inventive concepts disclosed herein. Accordingly, the invention should not be viewed as limited except by the scope and spirit of the appended claims.

What is claimed is:

1. A method of producing a digital representation of an analog input signal comprising the steps of:
    a. in response to a first control signal, producing a timing signal that defines a sampling window having a time interval timed by a clock having a plurality of clock cycles;
    b. responsive to the start of said sampling window enabling a first current source that produces a first current that is proportional to said analog input signal and performing a first integration function to produce a ramp voltage on an integration capacitor coupled to said first current source, wherein said ramp voltage has a starting voltage at the start of said sampling window and said ramp voltage generally has a first slope of a first direction during a first ramp voltage portion, wherein said first current source ceases to perform said first integration function at the end of said sampling window;
    c. at least in part in response to said first ramp voltage portion intersecting a first threshold voltage during said sampling window, performing a second integration function by enabling a second current source that produces a predetermined reference current and coupling said second current source to said integration capacitor so that both said first and second current sources are coupled to said integration capacitor to produce a second ramp voltage portion, wherein said reference current is greater than said first current and said ramp voltage during said second ramp voltage portion has a slope opposite in direction to said first ramp voltage portion;
    d. at least in part in response to said second ramp voltage portion intersecting a second threshold voltage, disabling said second current source; and
    e. counting all clock pulses produced by a clock with a first counter while said second current source is enabled to produce a digital value indicative of the magnitude of said analog input signal.

2. The method of claim 1 wherein said analog input signal is an input voltage.

3. The method of claim 1 wherein said step of enabling said second current source comprises the step of enabling said second current source at the start of a next clock cycle after said ramp voltage intersects said first threshold voltage and said step of disabling said second current source comprises the step of disabling said second current source at the start of a next clock cycle after said second ramp voltage portion intersects said second threshold voltage.

4. The method of claim 3 further including the step of repeating steps c and d if said sampling window has not ended.

5. The method of claim 4 wherein said second threshold voltage is between said starting voltage and said first threshold voltage.

6. The method of claim 5 further including the steps of:
    enabling said second current source to produce a third ramp voltage portion that intersects said second threshold voltage if said second current source is not enabled at the end of said sampling window and said ramp voltage at the end of said sampling window is not between said starting voltage and said second threshold voltage; and
    disabling said second current source in response, at least in part, to said third ramp voltage portion intersecting said second threshold voltage.

7. The method of claim 6 wherein said step of disabling said second current source in response, at least in part, to said third ramp voltage portion intersecting said second threshold voltage comprises the step of disabling said second current source at a transition time at the start of a next clock cycle after said third ramp voltage portion intersects said second threshold voltage.

8. The method of claim 7 further including the steps of:
    enabling at said transition time, a second counter having n bits;
    performing a third integration function using a third current source to produce a fourth ramp voltage portion that causes said ramp voltage to ramp from a ramp voltage at said transition point to said starting voltage;
    disabling said third current source at an end point of an analog to digital conversion when said ramp voltage during said fourth ramp voltage portion equals said starting voltage; and
    counting said clock cycles occurring during said fourth ramp voltage portion, wherein said first counter contains a count value at said end point that corresponds to most significant bits of a digital representation of said analog input signal and said second counter contains a count value at said end point that corresponds to least significant bits of said digital representation of said analog input signal.

9. The method of claim 8 wherein said third current source has a current value equal to said predetermined reference current divided by $2^n$.

10. The method of claim 5 further including the steps of:
leaving said second current source enabled to produce a third ramp voltage portion that intersects said second threshold voltage if said second current source is enabled at the end of said sampling window and an ending ramp voltage at the end of said sampling window is not between said starting voltage and said second threshold voltage; and
disabling said second current source in response, at least in part, to said third ramp voltage portion intersecting said second threshold voltage.

11. The method of claim 10 wherein said step of disabling said second current source in response, at least in part, to said third ramp voltage intersecting said second threshold voltage comprises the step of disabling said second current source at a transition time at the start of the next clock cycle after said third ramp voltage intersects said second threshold voltage.

12. The method of claim 11 further including the steps of:
enabling at said transition time, a second counter having n bits;
performing a third integration function using a third current source to produce a fourth ramp voltage portion that causes said ramp voltage to ramp from a ramp voltage at said transition point to said starting voltage;
disabling said third current source at an end point of an analog to digital conversion when said ramp voltage during said fourth ramp voltage portion equals said starting voltage; and
counting said clock cycles occurring during said fourth ramp voltage portion, wherein said first counter contains a count value at said end point that corresponds to most significant bits of a digital representation of said analog input signal and said second counter contains a count value at said end point that corresponds to least significant bits of said digital representation of said analog input signal.

13. The method of claim 12 wherein said third current source has a current value equal to said predetermined reference current divided by $2^n$.

14. The method of claim 1 wherein said starting voltage equals said second threshold voltage.

15. The method of claim 14 wherein said step of enabling said second current source comprises the step of enabling said second current source at the start of a next clock cycle after said ramp voltage intersects said first threshold voltage during said sampling window and said step of disabling said second current source comprises the step of disabling said second current source at the start of a next clock cycle after said second ramp voltage portion intersects said second threshold voltage during said sampling window.

16. The method of claim 15 further including the step of repeating steps c and d if said sampling window has not ended.

17. The method of claim 16 further including the steps of:
determining if said second current source is enabled at the end of said sampling window;
if said second current source is not enabled at the end of said sampling window and said ramp voltage at the end of sampling window is above said starting voltage, enabling said second current source to produce a third ramp voltage portion that intersects said starting voltage; and
in response at least in part to said third ramp voltage portion intersecting said starting voltage, disabling said second current source.

18. The method of claim 16 further including the steps of:
determining if said second current source is enabled at the end of said sampling window;
if said second current source is enabled at the end of said sampling window and said ramp voltage at the end of said sampling window is above said starting voltage, leaving said second current source enabled to produce a third ramp voltage portion that intersects said starting voltage; and
in response at least in part to said third ramp voltage portion intersecting said starting voltage, disabling said second current source.

19. The method of claim 1 wherein said step of enabling said first current source comprises the step of enabling said first current source to charge said integration capacitor and said step of enabling said second current source comprises the step of enabling said second current source to discharge said capacitor.

20. The method of claim 1 wherein said step of enabling said first current source comprises the step of enabling said first current source to discharge said integration capacitor and said step of enabling said second current source comprises the step of enabling said second current source to charge said integration capacitor.

21. The method of claim 8 wherein said second and third current sources comprise a digital to analog converter operative to provide first and second current source values in response to the application of first and second predetermined inputs to said digital to analog converter.

22. An analog to digital converter for producing a digital representation of an analog input signal comprising:
a. a clock operative to produce successive clock cycles;
b. a timer in communication with said clock and operative in response to a first control signal, to produce a timing signal that defines a sampling window having a time interval corresponding to a plurality of clock cycles, said sampling window having a window beginning and a window end;
c. an integration capacitor;
d. a first current source that produces a first current that is proportional to said analog input signal, said first current source coupleable to and cooperative with said integration capacitor and operative at least in part in response to said window beginning to produce a ramp voltage on said integration capacitor, wherein said ramp voltage has a starting voltage at the beginning of said sampling window and said ramp voltage generally has a first slope of a first direction during a first ramp voltage portion, wherein said first current source is disabled at the end of said sampling window;
e. a second current source for providing a fixed predetermined reference current that is greater than a largest possible value of said first current in said analog to digital converter, said second current source coupleable to said integration capacitor and cooperative with said first current source and said integration capacitor to produce a second ramp voltage portion having a slope opposite in direction to said first ramp voltage portion;
f. control logic responsive at least in part to said first ramp voltage portion intersecting a first threshold voltage during said sampling window, for enabling said second current source to produce the second ramp voltage portion having a slope opposite in direction to said first ramp voltage portion, said control logic being further operative, at least in part in response to said second ramp voltage portion intersecting a second threshold voltage, to disable said second current source during said sampling window; and g. a first counter operative to count clock cycles produced by said clock while said second current source is enabled to produce a digital value in said first counter at an end of said analog to digital conversion that is indicative of a magnitude of said analog input signal.

23. The analog to digital converter of claim 22 wherein said analog input signal is an input voltage.

24. The analog to digital converter of claim 22 wherein said control logic is operative in response to the start of a next clock cycle after said first ramp voltage portion intersects said first threshold voltage to enable said second current source and, said control logic is operative in response to the start of the next clock cycle after said second ramp voltage portion intersects said second threshold voltage to disable said second current source.

25. The analog to digital converter of claim 24 wherein said second threshold voltage is between said starting voltage and said first threshold voltage.

26. The analog to digital converter of claim 25 wherein said control logic is operative to enable said second current source to produce a third ramp voltage that intersects said second threshold voltage if said second current source is not enabled at the end of said sampling window and said ramp voltage at the end of sampling window is not between said starting voltage and said second threshold voltage and said control logic is operative to disable said second current source in response, at least in part to said third ramp voltage portion intersecting said second threshold voltage.

27. The analog to digital converter of claim 26 wherein said control logic is operative to disable said second current source at a transition time at the start of a next clock cycle after said third ramp voltage portion intersects said second threshold voltage.

28. The analog to digital converter of claim 27 further including a second counter having n bits, said control logic being operative to:
    enable a third current source to produce a fourth ramp voltage portion that causes said ramp voltage to ramp from a ramp voltage at said transition point to said starting voltage;
    disable said third current source at an end point of an analog to digital conversion when said ramp voltage during said fourth ramp voltage portion equals said starting voltage; and
    enable said second counter to count said clock cycles occurring during said fourth ramp voltage portion, wherein said first counter contains a count value at said end point that corresponds to most significant bits of a digital representation of said analog input signal and said n bits of said second counter contains a count value at said end point that corresponds to least significant bits of said digital representation of said analog input signal.

29. The analog to digital converter of claim 28 wherein said third current source has a current value equal to said predetermined reference current produced by said second current source divided by $2^n$.

30. The analog to digital converter of claim method of claim wherein said control logic is further operative to:
    leave said second current source enabled to produce a third ramp voltage portion that intersects said second threshold voltage if said second current source is enabled at the end of said sampling window and an ending ramp voltage at the end of said sampling window is not between said starting voltage and said second threshold voltage; and
    disable said second current source in response at least in part to said third ramp voltage portion intersecting said second threshold voltage.

31. The analog to digital converter of claim 30 wherein said control logic is operative to disable said second current source at a transition time at the start of a next clock cycle after said third ramp voltage portion intersects said second threshold voltage.

32. The analog to digital converter of claim 31 further including a second counter having n bits, said control logic operative to enable a third current source to produce a fourth ramp voltage portion that causes said ramp voltage to ramp from a ramp voltage at said transition point to said starting voltage and to disable said third current source at an end point of said analog to digital conversion when said ramp voltage equals said starting voltage, said second counter being operative to count said clock cycles occurring during said fourth ramp voltage portion, wherein said first counter contains a count value at said end point that corresponds to most significant bits of a digital representation of said analog input signal and said second counter contains a count value at said end point that corresponds to least significant bits of said digital representation of said analog input signal.

33. The analog to digital converter of claim 32 wherein said third current source has a current value equal to said predetermined reference current divided by $2^n$.

34. The analog to digital converter of claim 22 wherein said starting voltage equals said second threshold voltage.

35. The analog to digital converter of claim 34 wherein said control logic is operative to enable said second current source at the start of a next clock cycle after said first ramp voltage portion intersects said first threshold voltage during said sampling window and said control logic is operative to disable said second current source at the start of a next clock cycle after said second ramp voltage portion intersects said second threshold voltage during said sampling window.

36. The analog to digital converter of claim 35 wherein said control logic is operative to enable said second current source to produce a third ramp voltage portion that intersects said starting voltage if said second current source is not enabled at the end of said sampling window and said ramp voltage at the end of said sampling window is above said starting voltage, and said control logic is operative to disable said second current source in response, at least in part, to said third ramp voltage portion intersecting said starting voltage.

37. The analog to digital converter of claim 36 wherein said control logic is operative to leave said second current source enabled to produce the third ramp voltage portion that intersects said starting voltage if said second current source is enabled at the end of said sampling window and said ramp voltage at the end of said sampling window is above said starting voltage and, said control logic is operative to disable said second current source in response, at least in part, to said third ramp voltage portion intersecting said starting voltage.

38. The analog to digital converter of claim 22 wherein said first current source is operative to charge said integration capacitor when said first current source is enabled and said second current source is operative to discharge said integration capacitor when said second current source is enabled.

39. The analog to digital converter of claim 22 wherein said first current source is operative to discharge said integration capacitor when said first current source is enabled and said second current source is operative to charge said integration capacitor when said second current source is enabled.

40. The analog to digital converter of claim 28 further including control logic, wherein said second and third current sources comprise a digital to analog converter operative to produce first and second predetermined current source values in response to the application by said control logic of first and second predetermined digital inputs to said digital to analog converter.

\* \* \* \* \*